(12) United States Patent
Su et al.

(10) Patent No.: US 9,358,660 B2
(45) Date of Patent: Jun. 7, 2016

(54) GRINDING WHEEL DESIGN WITH ELONGATED TEETH ARRANGEMENT

(71) Applicant: Taiwan Semiconductor Manufacturing Company, Ltd., Hsin-Chu (TW)

(72) Inventors: Chun-Hsing Su, New Taipei (TW); Jing-Cheng Lin, Hsin-Chu (TW); Tsei-Chung Fu, Toufen Township (TW); Wen-Hua Chang, Hsin-Chu (TW); Yi-Chao Mao, Zhongli (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/724,916

(22) Filed: May 29, 2015

(65) Prior Publication Data

US 2015/0258657 A1      Sep. 17, 2015

Related U.S. Application Data

(63) Continuation-in-part of application No. 13/290,879, filed on Nov. 7, 2011.

(51) Int. Cl.
*B24B 37/16* (2012.01)
*B24B 7/22* (2006.01)
(Continued)

(52) U.S. Cl.
CPC .............. *B24B 37/16* (2013.01); *B24B 7/228* (2013.01); *B24B 37/013* (2013.01); *B24B 49/10* (2013.01); *B24B 49/12* (2013.01); *H01L 21/67253* (2013.01); *H01L 21/6835* (2013.01); *H01L 22/12* (2013.01); *H01L 22/26* (2013.01); *H01L 24/19* (2013.01); *H01L 24/20* (2013.01);

*H01L 24/97* (2013.01); *H01L 21/6836* (2013.01); *H01L 23/3114* (2013.01); *H01L 23/5389* (2013.01); *H01L 2221/68318* (2013.01); *H01L 2221/68327* (2013.01); *H01L 2221/68377* (2013.01); *H01L 2221/68381* (2013.01);
(Continued)

(58) Field of Classification Search
CPC ...... B24B 37/16; B24B 7/228; B24B 37/013; B24B 49/12; B24B 49/10; H01L 21/67253; H01L 22/12; H01L 22/26; H01L 24/19; H01L 24/20; H01L 21/6835; H01L 24/97; H01L 2224/97; H01L 2924/1431; H01L 2924/12042; H01L 2924/83; H01L 2924/00
USPC ................................. 451/5, 550, 6, 285, 548
IPC ............................................. B24B 37/16, 33/04
See application file for complete search history.

(56) References Cited

U.S. PATENT DOCUMENTS

| 5,035,087 A | 7/1991 | Nishiguchi et al. |
| 5,069,002 A | 12/1991 | Sandhu et al. |

(Continued)

FOREIGN PATENT DOCUMENTS

| CN | 101456151 | 6/2009 |
| CN | 102176431 | 9/2011 |

(Continued)

*Primary Examiner* — Joseph J Hail
*Assistant Examiner* — Marc Carlson
(74) *Attorney, Agent, or Firm* — Slater Matsil, LLP

(57) ABSTRACT

A grinding wheel includes a base disk, and a plurality of teeth protruding beyond a surface of the base disk. The plurality of teeth is aligned to an elongated ring encircling a center of the grinding wheel.

20 Claims, 21 Drawing Sheets

(51) Int. Cl.
*B24B 37/013* (2012.01)
*B24B 49/12* (2006.01)
*H01L 21/67* (2006.01)
*B24B 49/10* (2006.01)
*H01L 21/66* (2006.01)
*H01L 23/00* (2006.01)
*H01L 21/683* (2006.01)
*H01L 23/31* (2006.01)
*H01L 23/538* (2006.01)

(52) U.S. Cl.
CPC ........ *H01L 2224/04105* (2013.01); *H01L 2224/12105* (2013.01); *H01L 2224/32225* (2013.01); *H01L 2224/73267* (2013.01); *H01L 2224/97* (2013.01); *H01L 2924/12042* (2013.01); *H01L 2924/1431* (2013.01)

(56) References Cited

U.S. PATENT DOCUMENTS

| | | |
|---|---|---|
| 5,245,794 A | 9/1993 | Salugsugan |
| 5,308,438 A | 5/1994 | Cote et al. |
| 5,668,063 A | 9/1997 | Fry et al. |
| 5,827,111 A | 10/1998 | Ball |
| 5,827,112 A | 10/1998 | Ball |
| 5,830,041 A | 11/1998 | Takahashi et al. |
| 5,851,135 A | 12/1998 | Sandhu et al. |
| 6,165,052 A | 12/2000 | Yu et al. |
| 6,207,533 B1 | 3/2001 | Gao |
| 6,293,845 B1 | 9/2001 | Clark-Phelps |
| 6,309,276 B1 | 10/2001 | Tsai et al. |
| 6,383,058 B1 | 5/2002 | Birang et al. |
| 6,464,564 B2 | 10/2002 | Sandhu et al. |
| RE38,029 E | 3/2003 | Cote et al. |
| 6,672,943 B2 * | 1/2004 | Vogtmann et al. ............. 451/41 |
| 6,739,944 B2 | 5/2004 | Sandhu et al. |
| 6,764,379 B2 | 7/2004 | Finarov |
| 6,932,674 B2 | 8/2005 | Lahnor et al. |
| 7,131,889 B1 | 11/2006 | Taylor |
| 7,390,744 B2 | 6/2008 | Jia et al. |
| 7,513,818 B2 | 4/2009 | Miller et al. |
| 7,614,932 B2 | 11/2009 | Finarov |
| 7,727,049 B2 | 6/2010 | Benvegnu et al. |
| 8,466,553 B2 | 6/2013 | Cheng et al. |
| 8,712,575 B2 | 4/2014 | Bhagavat et al. |
| 2001/0039064 A1 | 11/2001 | Ushio et al. |
| 2004/0142637 A1 | 7/2004 | Petroski et al. |
| 2005/0075055 A1 * | 4/2005 | Lanier et al. ............... 451/56 |
| 2008/0180695 A1 | 7/2008 | Komiyama et al. |
| 2009/0008794 A1 | 1/2009 | Wu et al. |
| 2009/0104846 A1 | 4/2009 | Junge et al. |
| 2010/0285723 A1 | 11/2010 | Lin et al. |
| 2011/0104987 A1 * | 5/2011 | David et al. ............... 451/5 |
| 2011/0237160 A1 | 9/2011 | Bhagavat et al. |
| 2011/0256805 A1 * | 10/2011 | David et al. ............... 451/5 |
| 2011/0275281 A1 * | 11/2011 | David et al. ............... 451/5 |

FOREIGN PATENT DOCUMENTS

| | | |
|---|---|---|
| JP | 2008186873 | 8/2008 |
| JP | 2010062251 | 3/2010 |
| KR | 1020050069771 | 7/2005 |
| KR | 1020070024735 | 3/2007 |
| WO | 2005123335 | 12/2005 |

\* cited by examiner

GRINDING WHEEL DESIGN WITH ELONGATED TEETH ARRANGEMENT

PRIORITY CLAIM AND CROSS-REFERENCE

This application is a continuation-in-part application of the following commonly-assigned U.S. patent application Ser. No. 13/290,879, filed Nov. 7, 2011, and entitled "End Point Detection in Grinding;" which application is hereby incorporated herein by reference.

BACKGROUND

In the manufacturing of integrated circuits, grinding is a commonly used technology. In a grinding process, a grinding wheel is placed over a wafer. The grinding wheel and the wafer both rotate, so that the thickness of the wafer is reduced due to the removal of the surface layers by the grinding wheel.

In the manufacturing of device wafers, grinding may be used in the backside thinning of silicon substrates, for example, in the formation of through-silicon vias (TSVs). There are other processes in which the grinding technology may be used. In the formation of fan-out chip scale packages, device wafers may be sawed, and the known-good-dies are selected and attached onto a carrier, with the known-good-dies spaced apart from each other. The known-good-dies include copper posts for the formation of fan-out connections. A molding compound is then filled into the space between and over the known-good-dies to form a fan-out wafer. After the curing of the molding compound, a grinding process may be performed to remove the portions of the molding compound and other dielectric materials over the copper posts. After the copper posts are exposed, electrical connections may be made to connect to the copper posts, so that the connections to the fan-out wafer are extended into an area larger than the area of the known-good-dies.

Since the layers that are subject to the grinding are often thin layers, accurately stopping the grinding process on the right time is vital to the yield of the integrated manufacturing process. For example, in the manufacturing of the fan-out wafer, the grinding needs to be stopped when the copper posts in substantially all known-good-dies throughout the fan-out wafer are fully exposed, and substantially no over-grinding occur. In the existing grinding technology, a gauge is used to detect the total thickness of the fan-out wafer during the grinding process. When the total thickness is reduced to a pre-determined value, it is assumed that the copper posts are fully exposed. This detection method, however, is inaccurate, and may result in yield loss.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
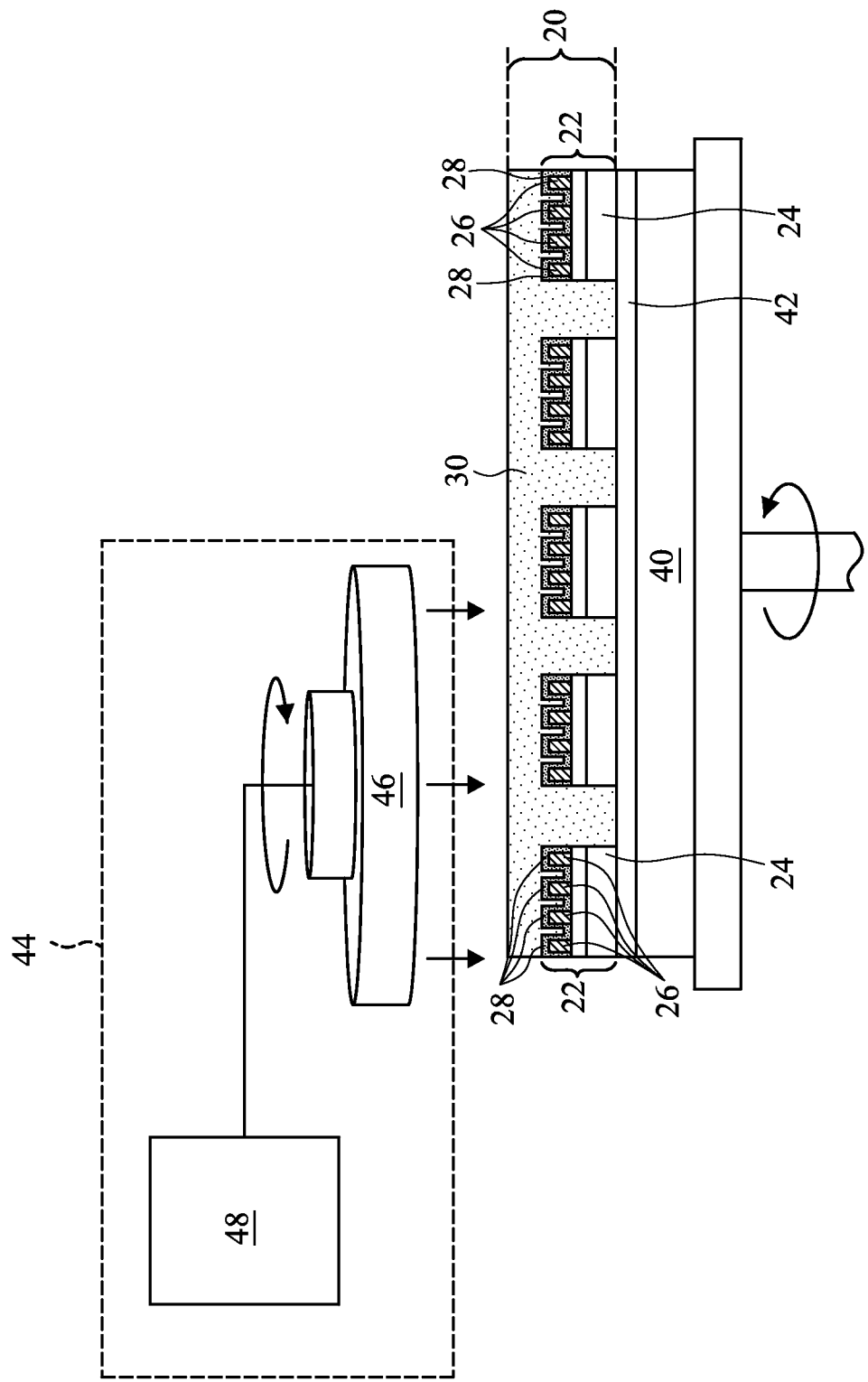
FIG. 1 illustrates a cross-sectional view of a wafer that includes device dies and a molding compound for molding the device dies, wherein a grinding process is performed on the wafer, and the wheel loading is measured.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A method of detecting end points in the grinding processes is provided in accordance with various embodiments. The variations of the embodiments are discussed. Throughout the various views and illustrative embodiments, like reference numbers are used to designate like elements. It is appreciated that although fan-out wafers for chip level packages (CSP) are used as examples, the end-point detection methods in accordance with embodiments may also be used for detecting end points in the grinding of other types of wafers, such as device wafers.

In addition, a grinding wheel is provided, wherein the grinding teeth in the grinding wheel have an elongated arrangement, so that the resulting ground wafer has a more uniform surface, and the non-uniformity in the grinding may be reduced through the elongated grinding teeth design.

FIG. 1 illustrates a cross-sectional view of wafer 20, which may be a fan-out wafer for forming fan-out connections, for example. Wafer 20 includes dies 22. In an embodiment, dies 22 are device dies that include active devices such as transistors (not shown). Dies 22 may be adhered on carrier 40 through adhesive 42. Adjacent to the top surface of dies 22 are metal posts 26 (which may be copper posts, for example), which are pre-formed in dies 22, and may be electrically coupled to the active devices in dies 22. In some embodiments, polymer layer 28, which may be a polyimide layer, is formed on metal post 26. Molding compound 30 is filled into the space between dies 22 and over die 22. It is noted that the materials and the structures of wafer 20 are examples for explaining the concept of the embodiments, and wafers with different materials and structures may be grinded using the end-point detection methods in accordance with embodiments. In accordance with exemplary embodiments, the grinding process is used to remove the portions of molding compound 30 and polymer layer 28, and to expose metal posts 26, so that fan-out connections may be formed to electrically couple to metal posts 26.

Wafer 20 is grinded by grinding tool 44, which includes grind wheel 46 that has grits for grinding the top surface of wafer 20. During the grinding process, grind wheel 46 and wafer 20 both rotate. Grinding tool 44 further includes control unit 48 for controlling the grinding process, and for controlling the action of grind wheel 46. During the grinding process, control unit 48 is capable of detecting of the surface being grinded, and adjusting the wheel loading of the grinding process accordingly. In some embodiments, grinding tool 44 adjusts wheel currents for driving grind wheel 46, and hence the wheel currents may be used to represent the wheel loading in accordance with exemplary embodiments. Exemplary grinding tools whose wheel currents can be used as the indication of wheel loading include DGP8761, which is manufactured by Disco Corporation. In alternative embodiments, the resistance force of the grinded surface and/or the wheel loading may be represented using other parameters.

Figure 2:
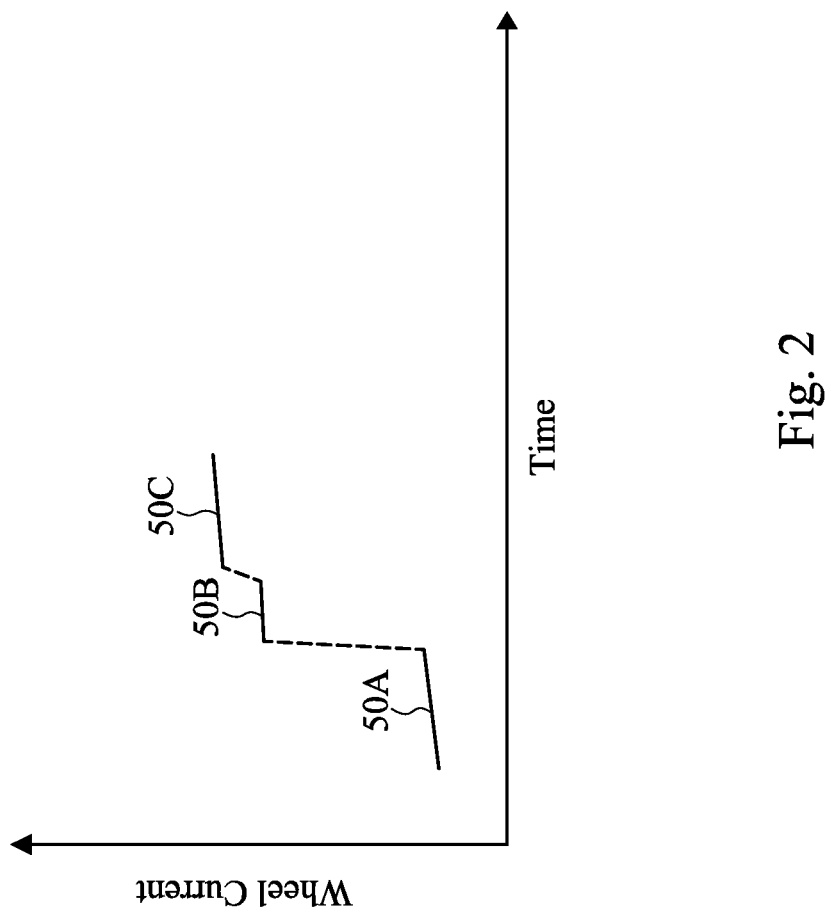
FIG. 2 schematically illustrates the wheel currents in the grinding process as a function of time.

FIG. 2 schematically illustrates the wheel currents as a function of grinding time in an exemplary grinding process of a sample wafer. In the grinding process, the wheel loading includes several sections, including 50A, 50B, and 50C, which correspond to grinding a molding compound layer, a polyimide layer, and a copper layer, respectively, of the sample wafer. FIG. 2 illustrates that for different materials, the wheel currents (wheel loadings) are different.

Figure 3:
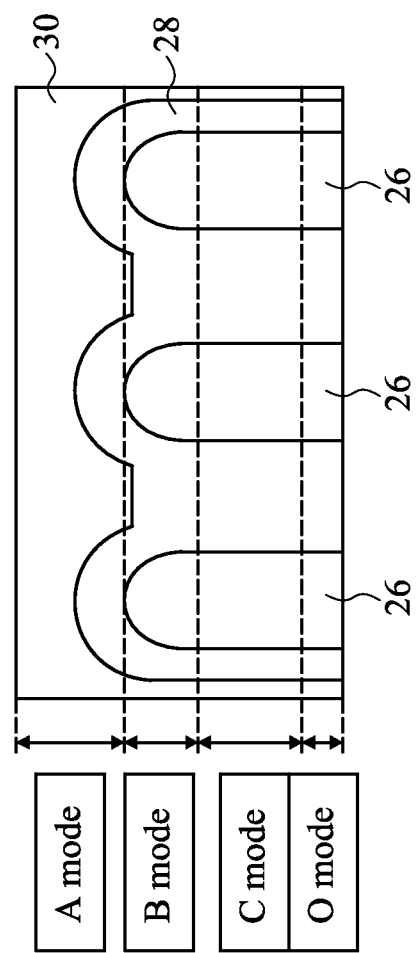
FIG. 3 illustrates a cross-sectional view of a portion of the wafer shown in FIG. 1, wherein different modes are used to represent the stages in a grinding process.

With the proceeding of the grinding process, upper layers are removed, and underlying layers are exposed and a grinded. FIG. 3 illustrates the cross-sectional view of a portion of the structure in FIG. 1, which portion includes metal posts 26, polymer layer 28, and molding compound 30. FIG. 3 schematically illustrates that the stages of the grinding process are represented by several modes, namely A mode, B mode, C mode, and O mode. During A mode, molding compound 30 and polymer layer 28 are grinded, and substantially none of metal posts 26 are grinded. During B mode, some of metal posts 26 throughout wafer 20 are exposed and are grinded, and the exposed metal posts 26 may have the tips being grinded, while the underlying portions having larger top-view areas may not be grinded yet. During the C mode, substantially all of the metal posts 26 are exposed and are grinded, and substantially no over-grinding occurs to metal posts 26 throughout wafer 20. In the O mode, over-grinding occurs. It is desirable that the optimal end point of the grinding is located in C mode, or at least in B mode, while A mode and O mode are not desired, and may be failure modes.

Since wheel loadings are different for grinding different materials (as indicated by FIG. 2), the wheel loadings in A mode, B mode, and C mode are different. The wheel loadings corresponding to the A, B, and C modes may be found by grinding a sample wafer, and inspect the sample wafer periodically during the grinding process to find the correlation between the modes and corresponding wheel loadings. The correlation may then be used for determining the optimal end points of the grinding processes, which grinding processes are used for grinding production wafers having the same structure as the sample wafer.

Figure 4:
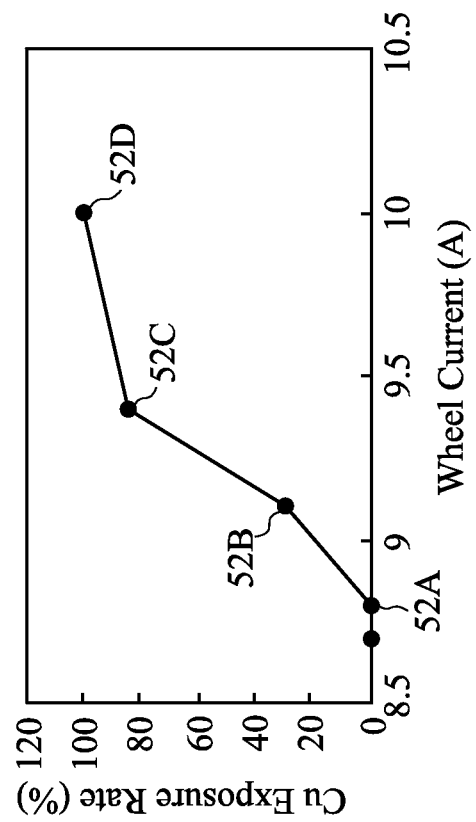
FIG. 4 schematically illustrates copper exposure rates of copper posts as a function of wheel currents in a grinding process.

FIG. 4 illustrates experiment results obtained from the grinding process of a sample fan-out wafer, wherein copper exposure rates (of metal posts 26) are illustrated as a function of the wheel loadings, which are expressed as wheel currents. Points 52A, 52B, 52C, and 52D are the points at which the sample fan-out wafer is inspected. Point 52A corresponds to the wheel current of 8.8 amps, at which time, out of 937 dies, the number of dies in A, B, C, and O modes are 936, 0, 0, and 1, respectively. Point 52B corresponds to the wheel current of 9.1 amps, at which time, the number of dies in A, B, C, and O modes are 666, 265, 2, and 1, respectively. Point 52C corresponds to the wheel current of 9.4 amps, at which time, the number of dies in A, B, C, and O modes are 150, 711, 73, and 1, respectively. Point 52D corresponds to the wheel current of 10 amps, at which time, out of 937 dies, the number of dies in A, B, C, and O modes are 9, 501, 424, and 1, respectively. It is observed that at point 52D, only 9 dies are still in A mode, while 925 dies out of 937 are either in B mode or C mode. After point 52D, To bring more dies from A and B modes into C mode, a further grinding is performed (using 10 amps wheel current) to remove an additional layer of wafer 20 that has thickness equal to about 1.1 µm. As a result, the number of dies in A, B, C, and O modes are 0, 16, 918, and 1, respectively. This is equivalent to 99.7 percent of copper exposure rate (FIG. 4). These experiment results indicate that the wheel loadings, such as wheel currents, can be used as an indicator for determining the optimal end points.

In general, in accordance with embodiments, a target wheel loading corresponding to the optimal end point may be found, for example, by performing a grinding process on a sample wafer and find a target wheel loading (such as the 10 amps current in FIG. 4). On the production wafers having the same structure as the sample wafer, the optimal end point may be when the target wheel loading is reached. In other embodiments, the end point is such determined that after the target wheel loading is reached, an extended grinding is performed to reduce the thickness of the wafer by a pre-determined grinding thickness (such as the 1.1 µm as in the example shown in FIG. 4). The pre-determined grinding thickness may also be between about 1 µm and about 5 µm. It is realized that this pre-determined grinding thickness is an example, and may be changed for grinding different wafers and for exposing different features. In yet other embodiments, the end point is such determined that after the target wheel loading is reached, an extended grinding is performed for an extended period of grinding time. In an exemplary embodiment, the extended grinding may be performed between about 10 seconds and about 50 seconds. The optimal duration for the extended grinding may be found through experiments. In some embodiments, grinding tool 44 as in FIG. 1 may automatically perform the extended grinding after the target wheel loading is reached, and then stop the grinding process. In other embodiments, the extended grinding process may be performed manually.

Figure 5:
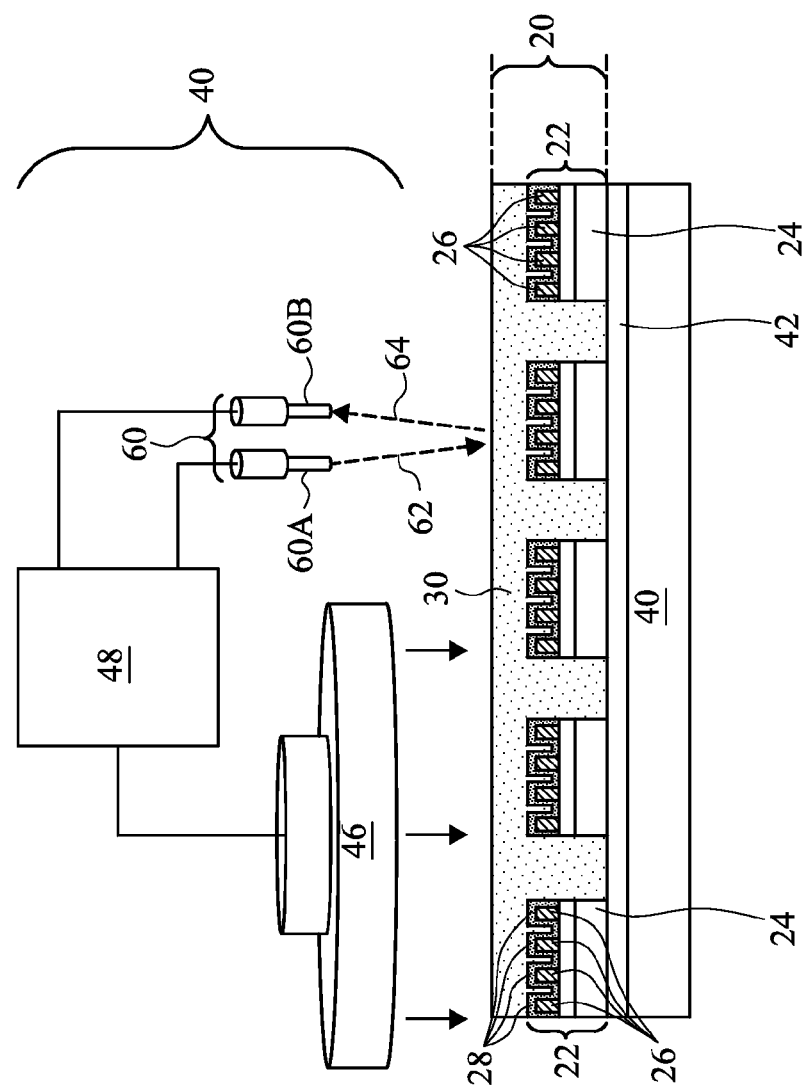
FIG. 5 illustrates a cross-sectional view of a wafer that comprises device dies and a molding compound for molding the device dies, wherein a grinding process is performed on the wafer, and a reflectivity of the wafer is measured.
Figure 6:
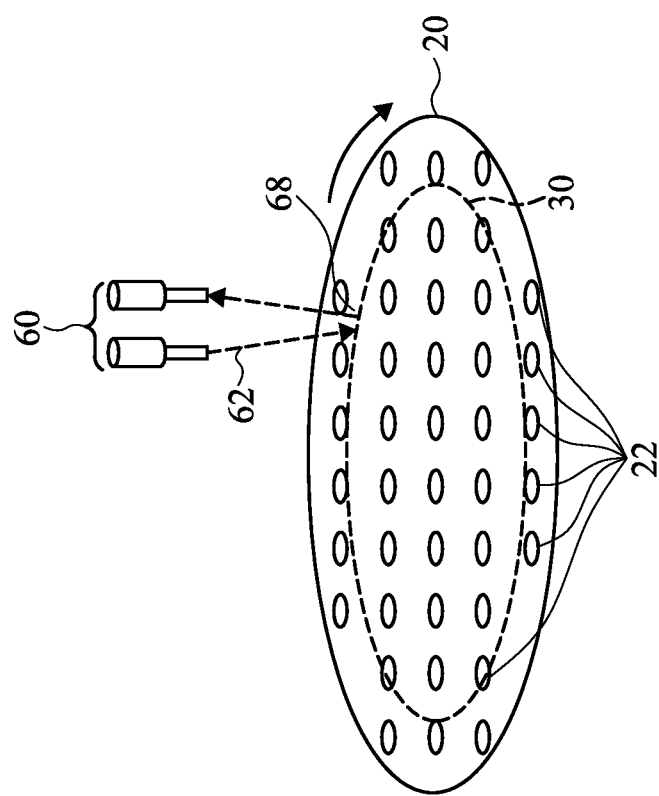
FIG. 6 illustrates that a light is emitted on a wafer for measuring the reflectivity, wherein the wafer is rotated.
Figure 7:
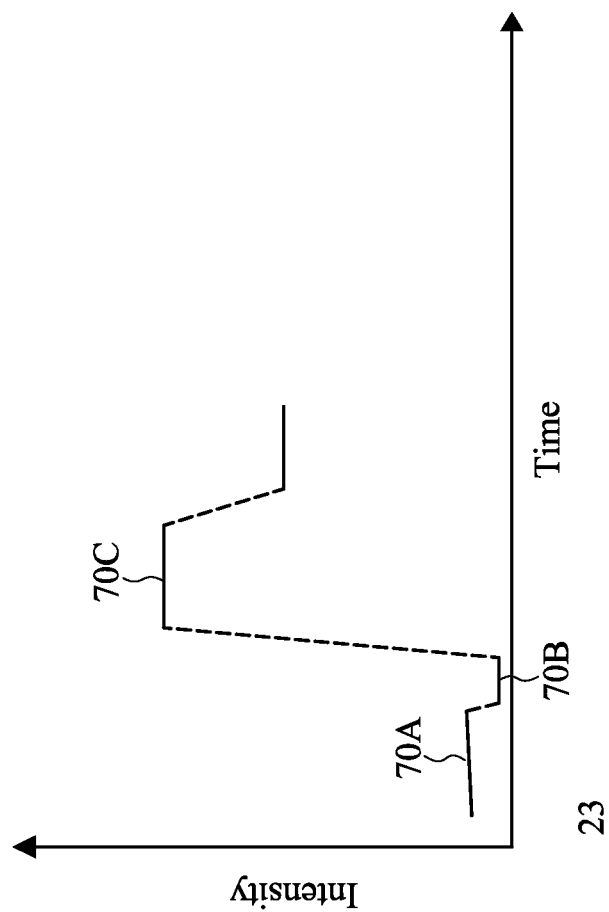
FIG. 7 schematically illustrates the light intensity of the light reflected from a wafer as a function of time in a grinding process.

FIGS. 5 through 7 illustrate a method for determining end points of grinding processes in accordance with alternative embodiments. These embodiments are similar to the embodiments shown in FIGS. 1 through 4, except that a reflectivity measured from the surface of the wafer being grinded, rather than the wheel loading, is used as criteria for determining the optimal end point. Unless specified otherwise, the materials and formation methods of the components in these embodiments are essentially the same as the like components, which are denoted by like reference numerals in the embodiments shown in FIGS. 1 through 4.

Referring to FIG. 5, light emitting/receiving gauges 60 are used for the measurement of the reflectivity, wherein light emitting/receiving gauges 60 may include light emitting gauge 60A for emitting light 62, and light receiving gauge 60B for receiving reflected light 64. Light emitting/receiving gauges 60 are non-contact gauges that do not contact wafer 20 during the grinding process. Light emitting/receiving gauges 60 may be parts of a reflectivity measurement tool, which is configured to measure the reflectivity by emitting light 62, measure the intensity of the reflected light, and calculating the reflectivity. Since light 64 may be reflected from the surface and also from the internal features of wafer 20, the reflectivity may be a function of the surface materials and the materials buried under the surface of wafer 20. The reflectivity may also be a function of the topology of the features in wafer 20.

Referring to FIG. 6, during the grinding process, light 62 that is emitted by light emitting/receiving gauges 60 is projected onto point 68 (which actually forms a circle with the rotation of wafer 20) of wafer 20. It is realized that even if light 62 may be projected to a fixed direction, and may be projected to one of metal post 26 (FIG. 1) at one time, with the spinning of wafer 20, at different time points, light 62 may be projected onto other features on wafer 20 such as molding compound 30 between dies 22 (FIG. 5). The measured reflectivity is thus the averaged result obtained from circle 68.

FIG. 7 schematically illustrates the intensity of the reflected light 64 (FIG. 5) as a function of time in an exemplary grinding process. Since the incident light 62 in FIG. 5 may have a fixed intensity, the intensity of the reflected light 64 may also represent the reflectivity since the reflectivity may be calculated by dividing the intensity of reflected light 64 by the intensity of the incident light 62. In the grinding process, the illustrated light intensity includes several sections, including 70A, 70B, and 70C, which correspond to grinding a molding compound layer, a polyimide layer, and a copper layer, respectively. FIG. 7 reveals that for different materials, the intensities of the reflected light 64, and hence the reflectivity, are different. Accordingly, the reflectivity may be used as an indicator for determining the optimal end point of the grinding process.

Figure 8:
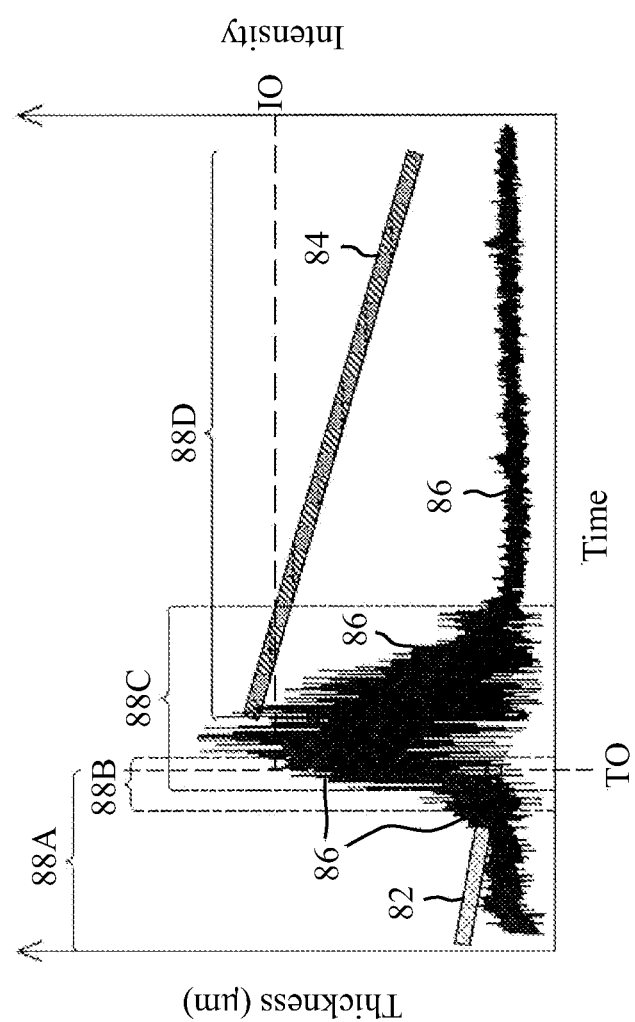
FIG. 8 illustrates thicknesses of a sample wafer and the intensity of the received reflected light as functions of a grinding time.

FIG. 8 illustrates the experiment results obtained from the grinding process of a sample fan-out wafer, wherein the thickness of the sample wafer and the intensity of the reflected light are illustrated as functions of grinding time. The left Y-axis shows the wafer thicknesses, and corresponds to lines 82 and 84. The right Y-axis shows the light intensity, and corresponds to the waveform 86. Line 82 represents the thickness of molding compound 30 (FIG. 1) as a function of grinding time, while line 84 represents the thickness of silicon substrate 24 (FIG. 1) as a function of grinding time. As shown in FIG. 8, the thickness of molding compound 30 is reduced with the proceeding of the grinding process. In the meantime, since other features such as polymer layer 28 and copper posts may be exposed with the proceeding of the grinding, with time, the light intensity (waveform 86) increases. The regions where molding compound 30, polymer layer 28, metal posts 26, and silicon substrate 24 are grinded are also shown as regions 88A, 88B, 88C, and 88B. An optimal end point may be selected when metal posts 26 and polymer layer 28 are both being grinded. Accordingly, time point T0 may be selected as an exemplary optimal end point, and the corresponding light intensity I0 is used to calculate the target reflectivity.

In general, in accordance with embodiments, a target reflectivity corresponding to the optimal end point may be found, for example, by performing a grinding process on a sample wafer, performing inspections periodically, and calculating the target reflectivity (such as from intensity level I0 in FIG. 8). On the production wafers that have the same structure as the sample wafer, the optimal end point is when the target reflectivity is reached. In other embodiments, the optimal end point is such determined that after the target reflectivity is reached, an extended grinding is performed for an extended period of grinding time, or for reducing the thickness of wafer 20 by a pre-determined value. The optimal duration for the extended grinding may be found through experiments.

Figure 9:
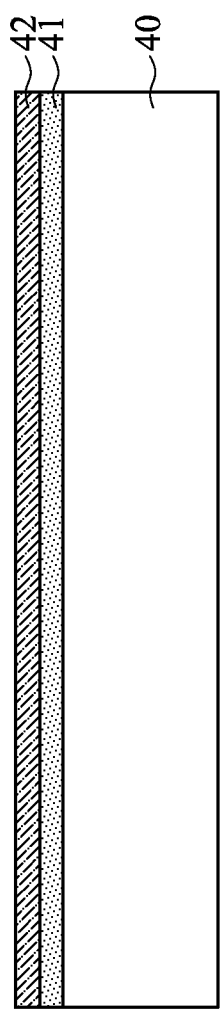
FIGS. 9 through 16 illustrate cross-sectional views of intermediate stages in the formation of a package in accordance with some embodiments of the present disclosure, in which a grinding process is performed.

FIGS. 9 through 16 illustrate the cross-sectional views of intermediate stages in the manufacturing of a package in accordance with some embodiments, in which a grinding process is performed. FIG. 9 illustrates carrier 40, release layer 41 over carrier 40, and Die-Attach Film (DAF) 42 over release layer 41. Carrier 40 may be a glass carrier, a ceramic carrier, or the like. Carrier 40 may have a round top-view shape and may have a size of a silicon wafer. For example, carrier 40 may have an fl-inch diameter, a 12-inch diameter, or the like. Release layer 41 may be formed of a polymer-based material (such as a Light To Heat Conversion (LTHC) material), which may be removed along with carrier 40 from the overlying structures that will be formed in subsequent steps. In accordance with some embodiments of the present disclosure, release layer 41 is formed of an epoxy-based thermal-release material, which will decompose under the heat of light. In accordance with other embodiments of the present disclosure, release layer 41 is formed of an ultra-violet (UV) glue. Release layer 41 may also be a laminate film laminated onto carrier 40. The top surface of release layer 41 is leveled and has a high degree of co-planarity. DAF layer 42 is laminated over release layer 41, and is used for allowing the subsequently placed dies 22 (FIG. 10) to attach to carrier 40.

Figure 10:
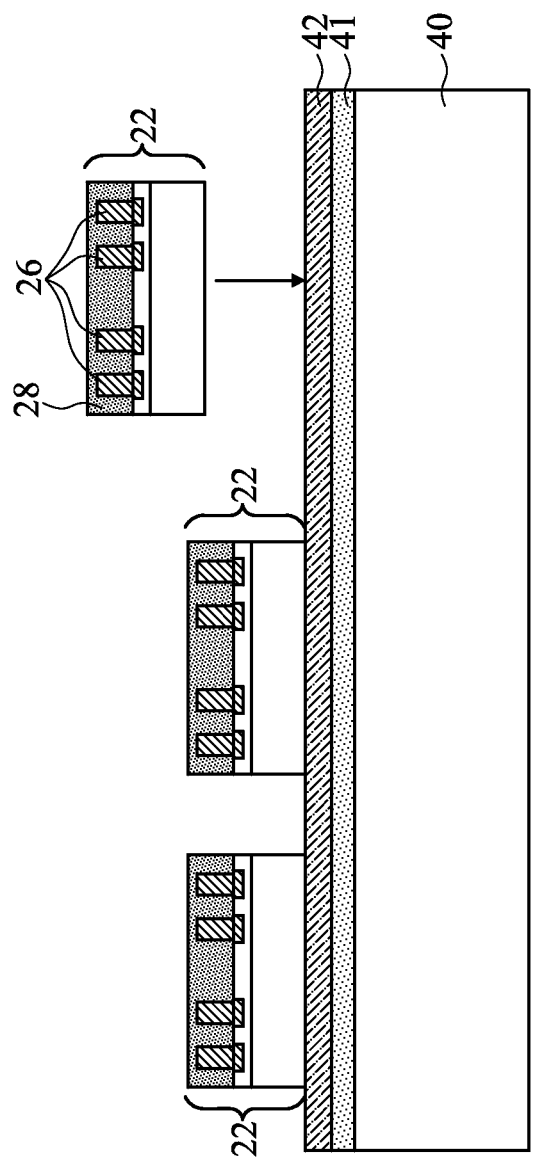

FIG. 10 illustrates the placement of device dies 22, which are adhered to DAF 42. Device dies 22 may be logic device dies including logic transistors therein. In accordance with some exemplary embodiments of the present disclosure, device dies 22 are designed for mobile applications. For example, device dies 22 may be Power Management Integrated Circuit (PMIC) dies, Transceiver (TRX) dies, or the like.

In accordance with some exemplary embodiments of the present disclosure, metal pillars 26 (such as a copper post) are pre-formed at the top surfaces of device dies 22, wherein metal pillars 26 are electrically coupled to the integrated circuit devices such as transistors in device dies 22. In accordance with some embodiments of the present disclosure, top dielectric layer 28 (which may be a polymer layer) fills the gaps between neighboring metal pillars 26. Top dielectric layer 40 may be formed of polybenzoxazole (PBO), polyimide, or another polymer in accordance with some embodiments.

Figure 11:
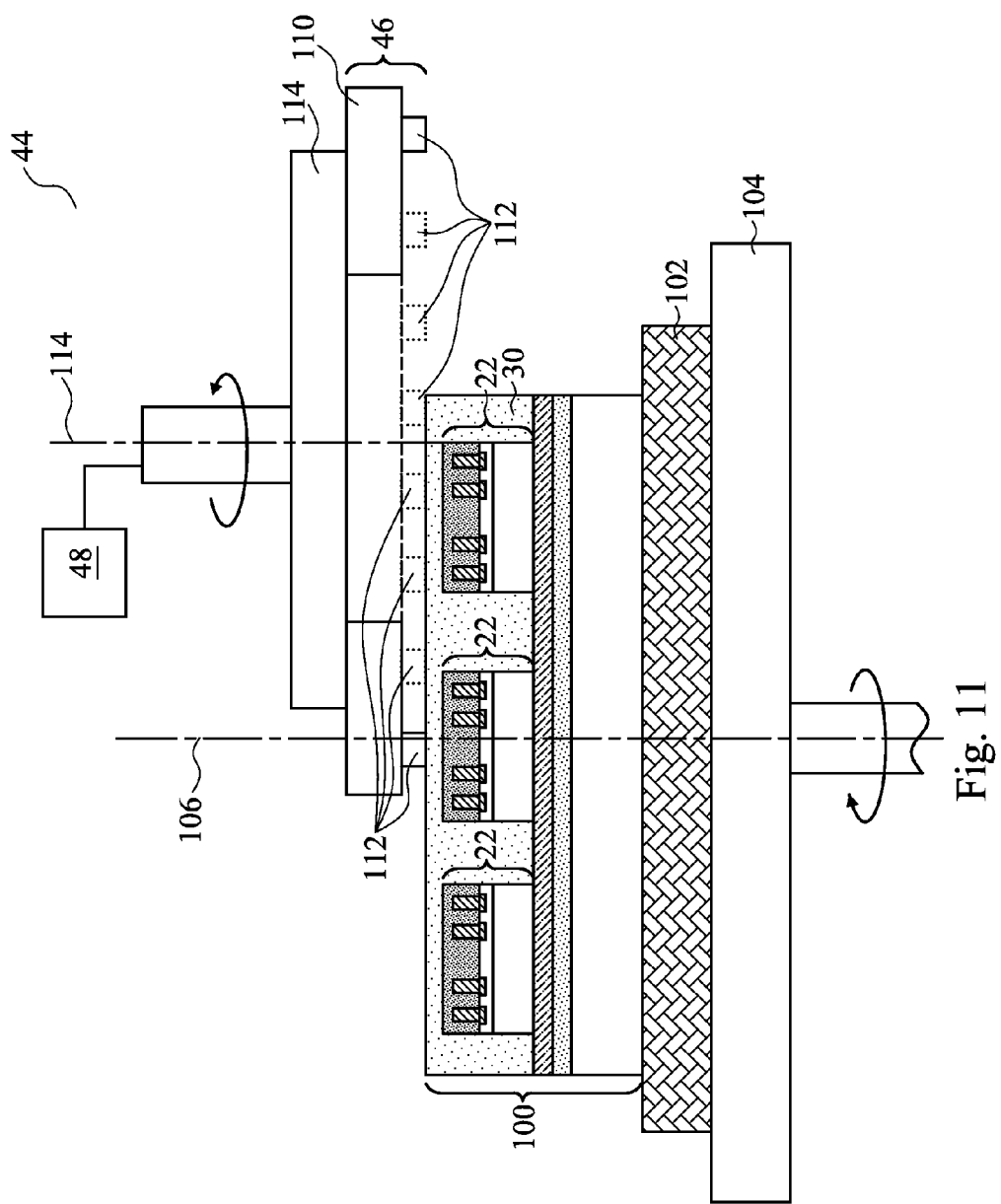

Next, molding material 30 is encapsulated on device dies 22 through a molding process. The resulting structure is shown in FIG. 11. Molding material 30 fills the gaps between neighboring device dies 22. Molding material 30 may include a molding compound, a molding underfill, an epoxy, or a resin. The top surface of molding material 30 is higher than the top ends of metal pillars 26. Throughout the description, carrier 40 and the overlying structures including device dies 22 and molding material 30 are in combination referred to as composite wafer 100.

Next, a grinding step is performed to thin molding material 30 until metal pillars 26 are exposed. The respective grinding process is also shown in FIG. 11. Due to the grinding, the top ends of metal pillars 26 are substantially coplanar with the top surface of molding material 30.

Referring to FIG. 11, grinding tool 44, which is used for the grinding process, is illustrated. Grinding tool 44 includes chuck 102 and turntable 104. Composite wafer 100 is placed over chuck 102. In accordance with some exemplary embodiments of the present disclosure, chuck 102 secures composite wafer 100 thereon through vacuum. Chuck 102 and composite wafer 100 are over turntable 104. Grinding tool 44 further includes the mechanism (such as motor, controller, etc., not shown) configured to rotate turntable 104 around axis 106. As a result, wafer 100 is also rotated around axis 106.

Grinding tool 44 includes grinding wheel 46, wherein wheel 46 contacts and abrades composite wafer 100 during the grinding process. Grinding wheel 46 includes base disk 110, which has a circular shape in the top view of grinding wheel 46. Grinding wheel 46 further includes a plurality of grinding teeth 112 protruding beyond (below) the bottom surface of base disk 110. Some of grinding teeth 112 are shown using dashed lines since these grinding teeth are not in the same plane as illustrated.

Grinding tool 44 includes the mechanism (such as the guide, motor, etc., not shown) configured to lift grinding wheel 46 up when no grinding is performed, and lower down grinding wheel 46 for the grinding. Grinding tool 44 also includes the mechanism (such as motor, controller, etc., not shown) to rotate grinding wheel 46 around axis 114, which is offset from axis 106. In accordance with some embodiments of the present disclosure, the locations of axis 106 and axis 114 are fixed, and both composite wafer 100 and grinding wheel 46 rotate simultaneously, so that grinding teeth 112 of grinding wheel 46 abrade composite wafer 100. In accordance with some embodiments of the present disclosure, teeth 112 are formed of diamond, silicon carbide, carbon nitride, or other types of abrasive materials. Teeth 112 have appropriate roughness and hardness for grinding composite wafer 100.

Figure 18:
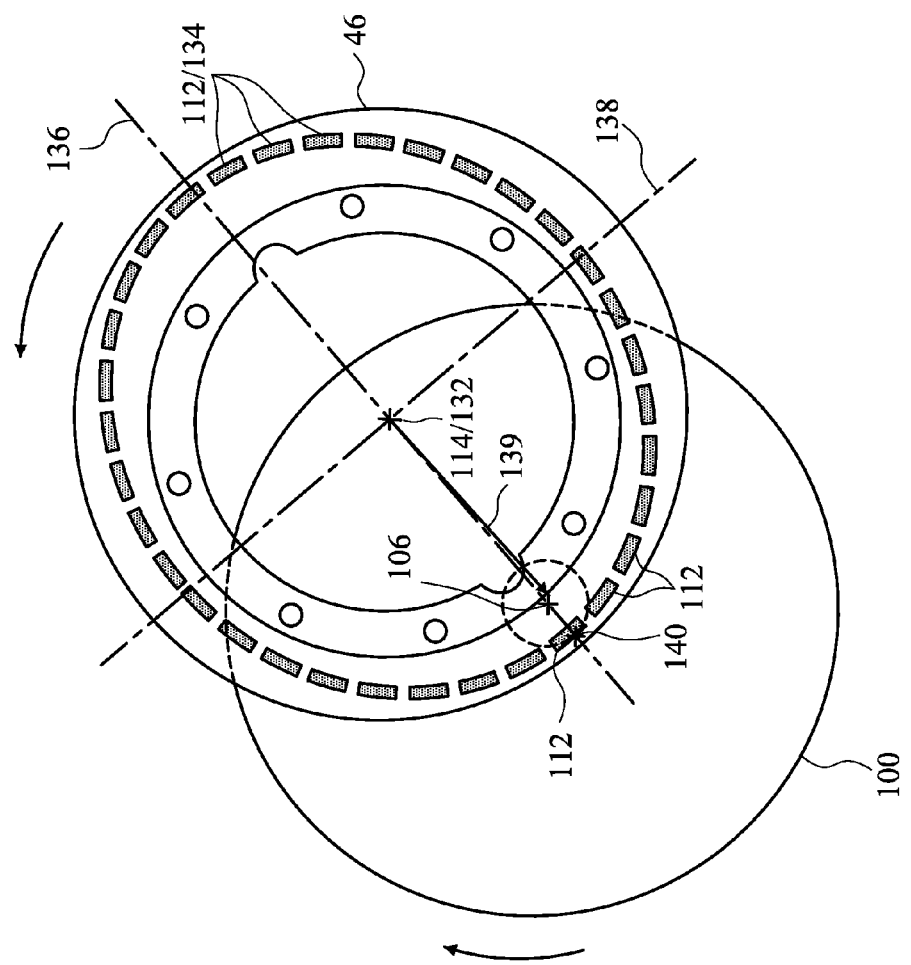
FIGS. 18 through 20 are top views of grinding processes in accordance with some embodiments.

FIG. 18 illustrates a top view of some portions of the structure illustrated in FIG. 11, wherein composite wafer 100 and grinding wheel 46 are illustrated. It is noted that although grinding teeth 112 are illustrated in FIG. 18, grinding teeth 112 are actually hidden behind base disk 110. Composite wafer 100 and grinding wheel 46 may counter-rotate (or rotate in a same direction) during the grinding process. For example, as shown in FIG. 18, composite wafer 100 may be rotated in a clockwise direction around axis 106, and grinding wheel 46 may be rotated in a counter-clockwise direction around axis 114. Through the rotation of both composite wafer 100 and grinding wheel 46, the entire tops surface of composite wafer 100 is ground by grinding wheel 46.

It is appreciated that although composite wafer 100 is used as an example to describe the grinding process and the respective grinding tool 44, other integrated circuit components such as silicon wafers, package substrates, interposers, or the like may also be ground using grinding tool 44.

Figure 12:
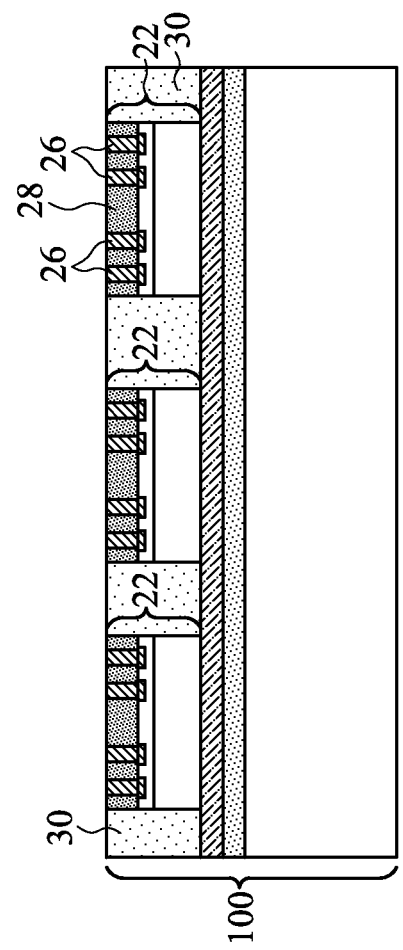
Figure 13:
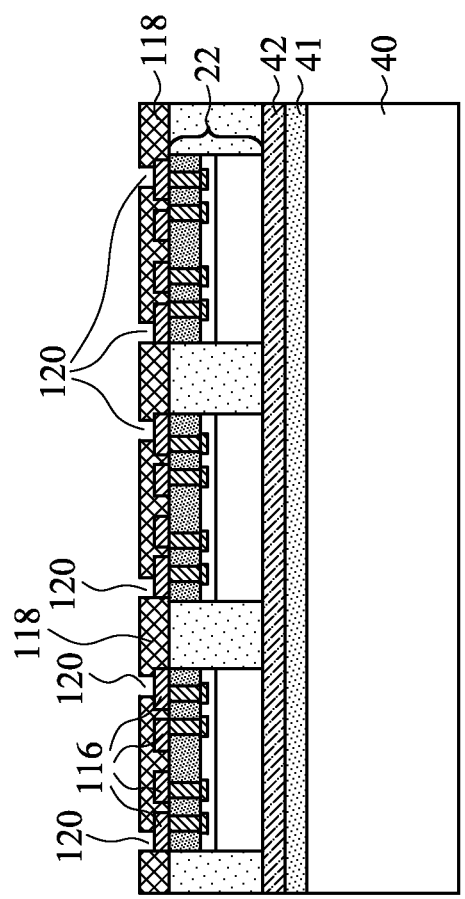

After the grinding process, device dies 22 and the respective metal pillars 26 are revealed, as shown in FIG. 12. Next, as shown in FIG. 13, Redistribution Lines (RDLs) 116 and dielectric layer(s) 118 are formed. For example, as shown in FIG. 13, RDLs 116 are formed on the top surfaces of molding material 30 and metal pillars 26. In accordance with some embodiments of the present disclosure, the formation of RDLs 116 includes depositing a metal layer (such as aluminum, aluminum copper, nickel, tungsten, or alloys thereof), and patterning the metal layer through an etching process. In accordance with alternative embodiments of the present disclosure, RDLs 116 are formed in a plating process, wherein each of RDLs 116 includes a seed layer (not shown) and a plated metallic material over the seed layer.

FIG. 13 also illustrates dielectric layer 118, which covers some portions of RDLs 116, while leaving some other portions not covered. In accordance with some embodiments of the present disclosure, dielectric layer 118 is formed of a polymer such as PBO, polyimide, or the like. In accordance with alternative embodiments of the present disclosure, dielectric layer 118 is formed of silicon nitride, silicon oxide, or multi-layers thereof. Openings 120 are formed in dielectric layer 118 to expose the pads of RDLs 116. The formation of openings 120 may be performed through a photo lithography process.

Figure 14:
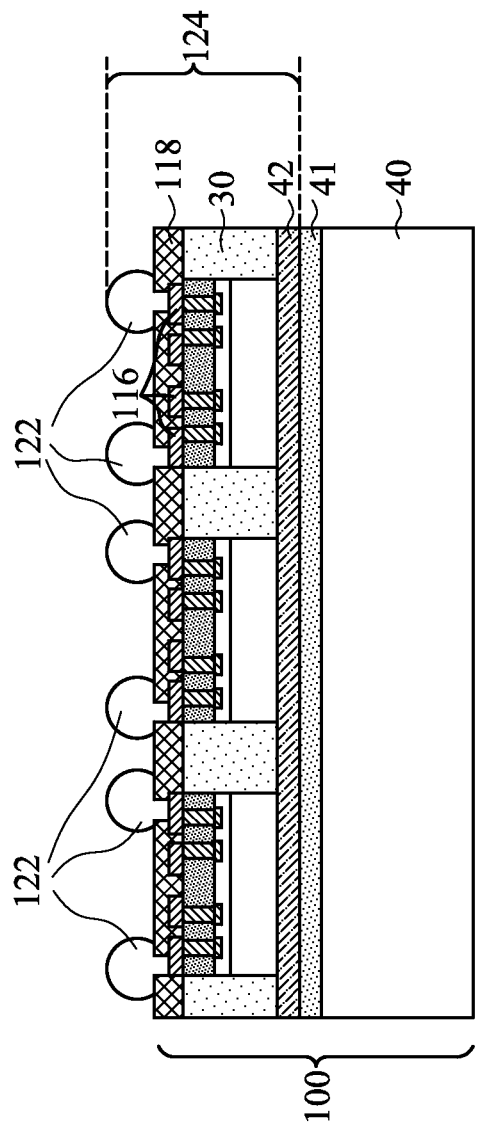

FIG. 14 illustrates the formation of electrical connectors 122 in accordance with some exemplary embodiments. The formation of electrical connectors 122 may include placing solder balls on the exposed portions of RDLs 116, and then reflowing the solder balls. In accordance with alternative embodiments of the present disclosure, the formation of electrical connectors 122 includes performing a plating step to form solder regions over RDLs 116 and then reflowing the solder regions. Electrical connectors 122 may also include metal pillars and optionally solder caps, which may also be formed through plating. Under-Bump Metallurgies (UBMs, not shown) may or may not be formed before the formation of electric connectors 122. The formation of the UBMs may include deposition and patterning.

Figure 15:
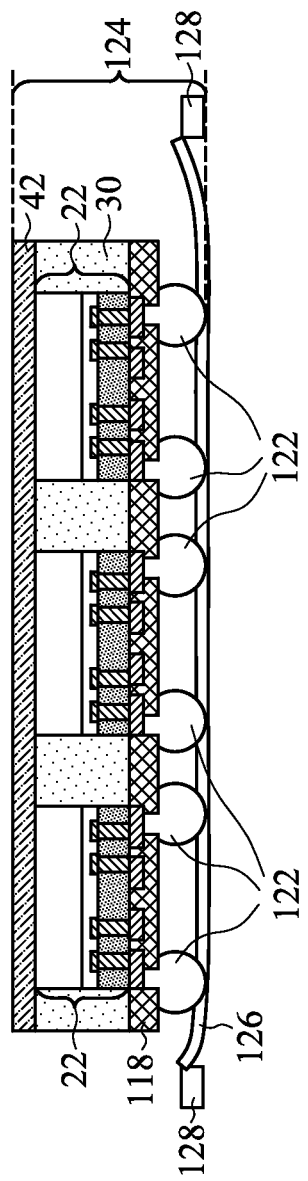
Figure 16:
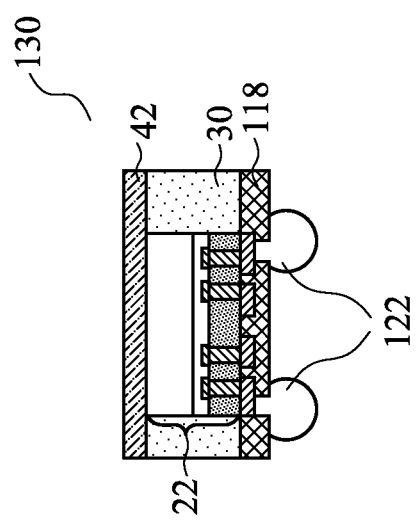

Next, the portions of composite wafer 100 over release layer 41 are de-bonded from carrier 40. The remaining portions of composite wafer 100 (excluding carrier 40 and release layer 41) are referred to as package 124, which is shown in FIG. 15. The de-bonding may be performed by projecting a light such as UV light or laser on release layer 41 to decompose release layer 41.

In subsequent steps, as shown in FIG. 15, package 124 is placed on dicing tape 126, which is fixed on frame 128. A die saw step is performed to saw package 124 into a plurality of packages 130 (FIG. 16), each including a device die 22.

Figure 17:
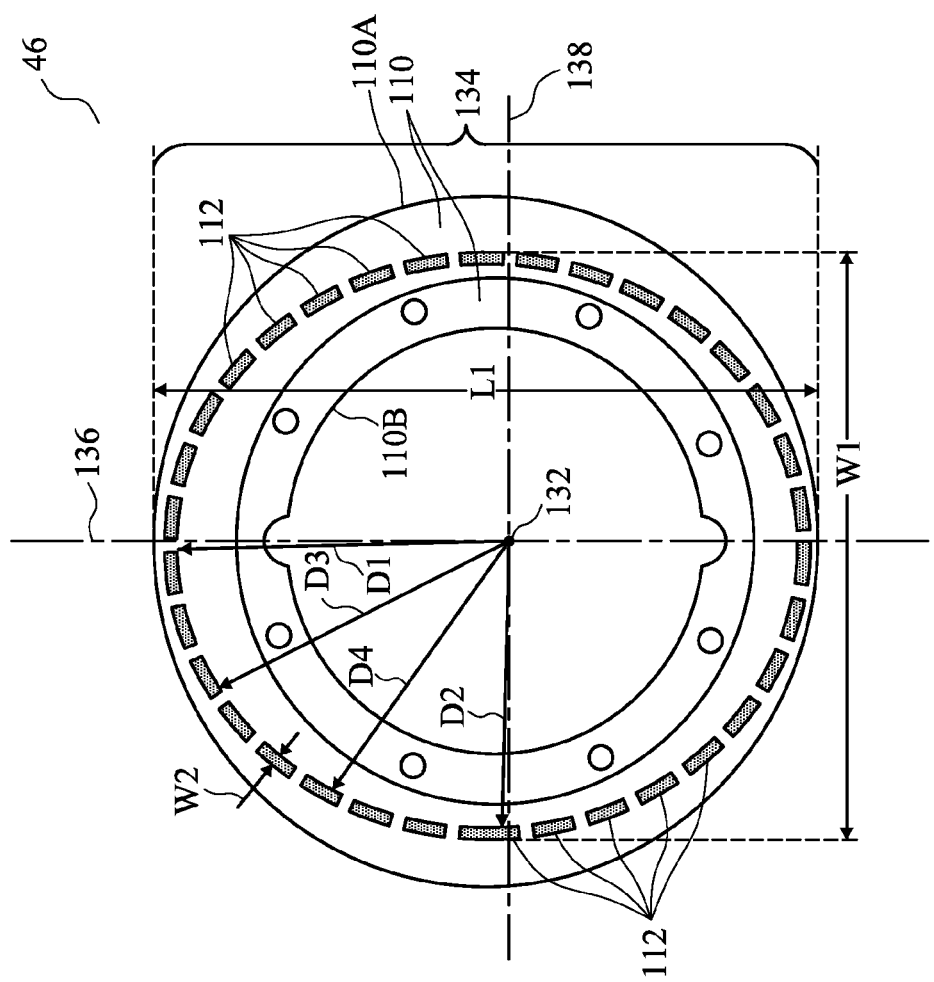
FIG. 17 illustrates a top view of a grinding wheel in accordance with some embodiments, wherein teeth of the grinding wheel are aligned to an elongated ring.

FIG. 17 illustrates a bottom view of grinding wheel 46 in accordance with some embodiments of the present disclosure. Grinding wheel 46 includes base disk 110, which forms a ring including outer edge 110A and inner edge 110B. Grinding wheel 46 has center 132. In accordance with some embodiments of the present disclosure, each of outer edge 110A and inner edge 110B forms a circle, with most of (or substantially all, except some indentations) of the points on the circle having equal distances to center 132. In accordance with some exemplary embodiments, the outer edge 110A has a diameter close to about 300 mm.

Grinding teeth 112 are located on one side (the illustrated bottom side as an example) of base disk 110, and protrude beyond the surface of base disk 110, so that in the grinding process, for example, as shown in FIG. 11, grinding teeth 112 are in contact with the surface to be ground, while base disk 110 is kept away from the surface to be ground.

Grinding teeth 112 includes a plurality of discrete teeth spaced apart from each other. For example, the total number of grinding teeth 112 may be in the range between about 20 and about 60, and more or fewer grinding teeth 112 may be used. The plurality of grinding teeth 112 is distributed along ring 134, which encircles center 132. In accordance with some embodiments of the present disclosure, ring 134 has a long axis 136 and a short axis 138. The dimension of ring 134 measured along long axis 136 is referred to as length L1, and the dimension of ring 134 measured along short axis 138 is referred to as width W1, which is smaller than length L1. Accordingly, ring 134 is referred to as an elongated ring hereinafter. The length L1 and width W1 are measured from the outer edges of grinding teeth 112.

Ring 134 may have an oval or any other regular or irregular shape. For example, FIG. 17 illustrates an oval shape, wherein center 132 is the symmetric center of the oval shape. Accordingly, when any straight line is drawn crossing center 132, the straight line will cross two points of ring 134 on the opposite sides of center 132, and center 132 will have equal distances to the two points. Furthermore, when measured from center 132 to a point of ring 134 on long axis 136, the distance is equal to D1, which is equal to (L1)/2 in accordance with some embodiments. Alternatively stated, the farthest teeth 112 from center 132 have distance D1. When measured from center 132 to a point of ring 134 on short axis 138, the distance is equal to D2, which is equal to (W1)/2 in accordance with some embodiments. Alternatively stated, the nearest teeth 112 from center 132 have distance D2. Throughout the description of the present disclosure, distance D1 and distance D2 are referred to as the maximum distance and the minimum distance, respectively, of ring 134 to center 132. The distance between center 132 and any other point on ring 134 is between D1 and D2. In accordance with some exemplary embodiments, the teeth increasingly distal long axis 136 and proximal short axis 138 have increasingly smaller distances from center 132. For example, distance D4 is smaller than distance D3, with distance D3 being measured from one of tooth 112 that is closer to long axis 136 than the tooth with distance D4.

In accordance with some embodiments of the present disclosure, difference (D1–D2) between maximum distance D1 and minimum distance D2 is intentionally designed, and is at least greater than that could be caused by the unintentional process variations in the manufacturing of grinding wheel 46. For example, difference (D1–D2) is greater than about 1 mm. In the embodiments in which grinding wheel 46 or teeth 112 have large size, distance (D1–D2) may also be increased. Difference (D1–D2) may also be in the range between about 2 mm and about 9 mm in accordance with some embodiments. In addition, when grinding teeth 112 have width W2, difference (D1–D2) may be greater than width W2 to disperse the over-grinding, as will be discussed in subsequent paragraphs.

Figure 19:
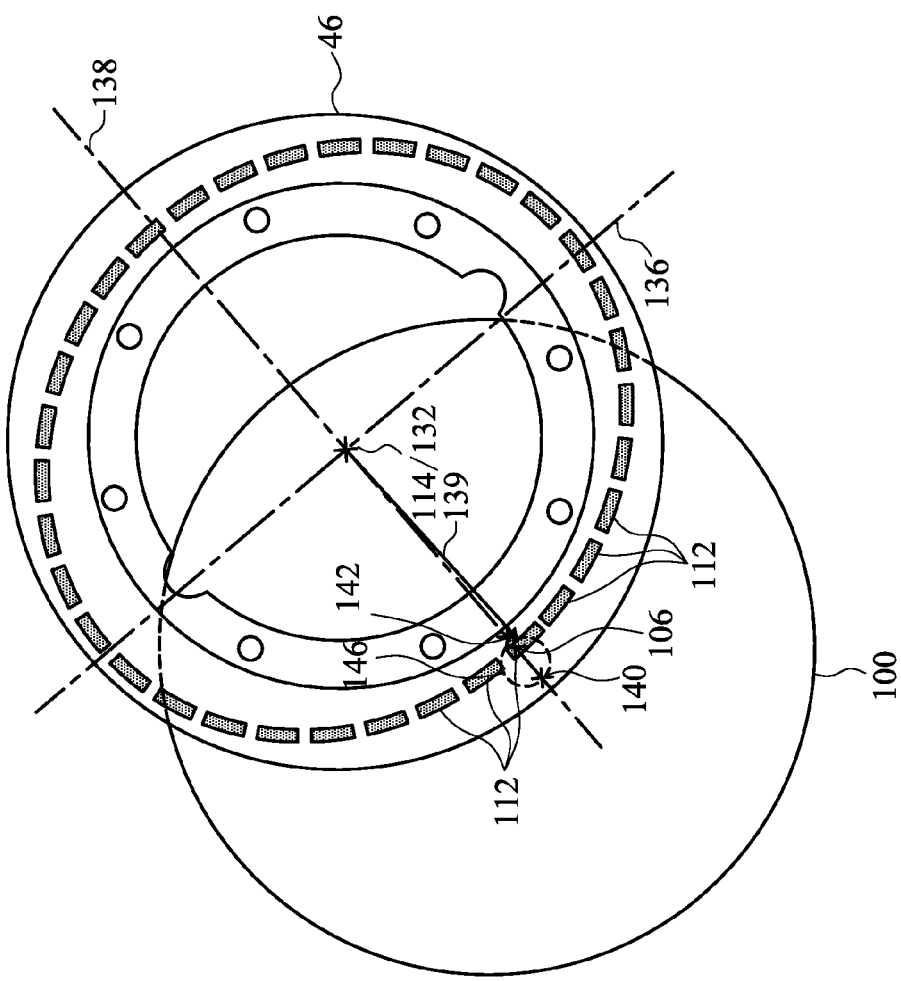

FIGS. 18 and 19 illustrate the top views of wafer 100 and grinding wheel 46 in a grinding process. In accordance with some embodiments of the present disclosure, as shown in FIG. 18, center 132 of grinding wheel 46 overlaps axis 114, around which grinding wheel 46 rotates. Wafer 100 rotates around axis 106. FIG. 18 illustrates connecting line 139 of axes 106 and 114, wherein connecting line 139 is marked as an arrow pointing from center 132 to axis 106). At any moment, there may be a tooth 112 that is aligned with (or closest to) connecting line 139. It is noted that the part of wafer 100 adjacent to this tooth is ground the most, and is most likely to be over-ground.

FIG. 18 illustrates a moment when the long axis of ring 134 is aligned to connecting line 139. In accordance with some embodiments of the present disclosure, at this moment, axis 106 is inside ring 134. Point 140 is marked in FIG. 18 to show the furthest point teeth 112 can reach in the direction of arrow 139.

FIG. 19 illustrates a moment when the short axis of ring 134 is aligned to connecting line 139. In accordance with some embodiments of the present disclosure, at this moment, axis 106 is also inside ring 134. Point 142 is marked in FIG. 19 to show the nearest point teeth 112 can reach in the direction marked by arrow 139.

Figure 21:
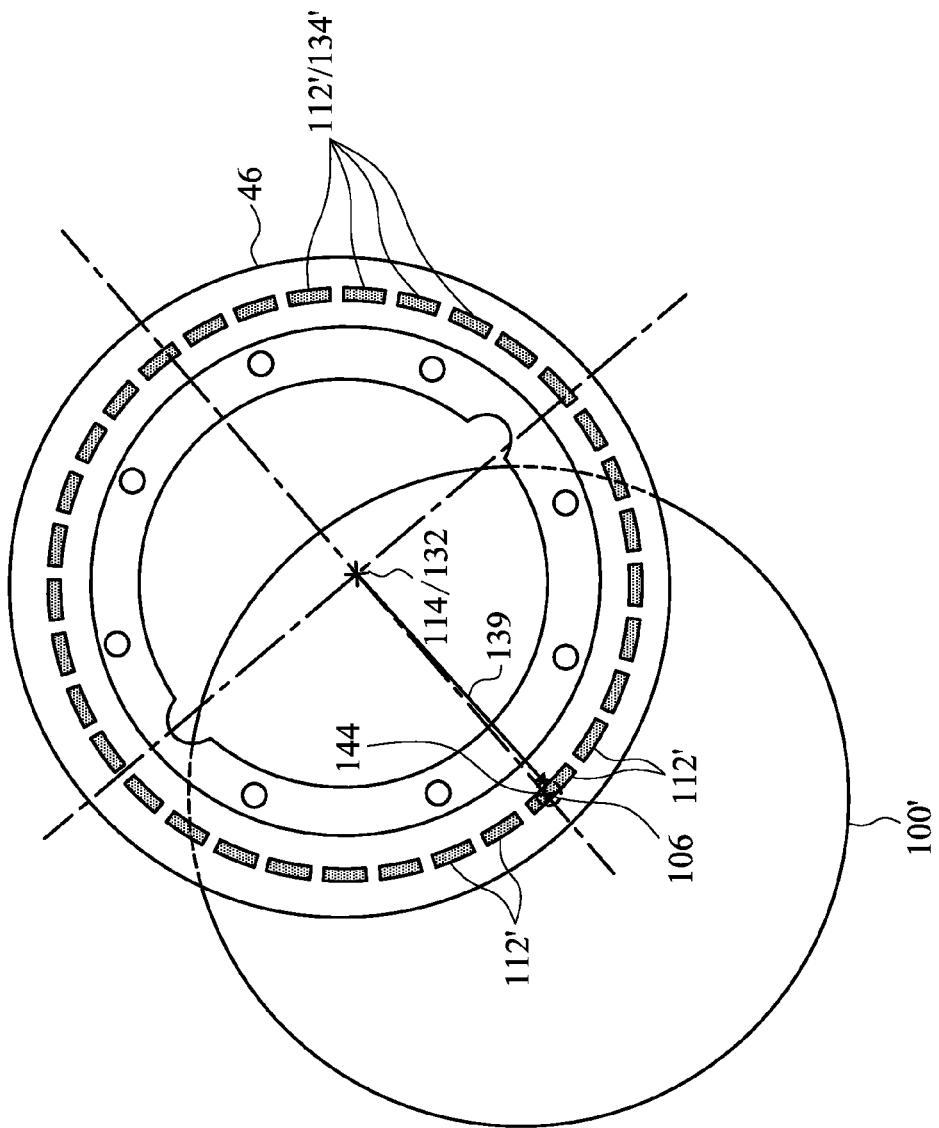
FIG. 21 illustrates a top view of a grinding process using a grinding wheel with its teeth aligned to a circle.

Comparing FIGS. 18 and 19, it is observed that with the rotation of grinding wheel 46, teeth 112 pass connecting line 139 one by one. Since ring 134 is elongated, different teeth 112 may pass different points of connecting line 139, rather than passing a fixed point of connecting line 139. Overall, teeth 112, when passing connecting line 139, will be in a position located in the range between points 140 and 142. This causes the advantageous reduction in the over-grinding of the center region of wafer 100. For example, referring to FIG. 21, which illustrates a prior art scenario wherein the ring 134' (aligned to by teeth 112') is a circle, with all teeth 112' having the same distance to rotation axis 114 and grinding wheel center 132. In FIG. 21, all teeth 112' will pass the same point of connecting line 139, and will grind the same small region 144. Accordingly, this part of wafer may be over-ground. However, as shown in FIG. 19, when teeth 112 pass connecting line 139 in positions oscillating between points 140 and 142, the over-ground region 146 has an increased area over the area of region 144 in FIG. 21. Alternatively stated, the over-grinding is dispersed, and hence the center region of wafer 100 is not over-ground beyond what is allowed by specification.

Furthermore, by making distance (D1–D2) (FIG. 17) to be greater than width W2 of teeth 112, the tooth aligned to connecting line 139 shown in FIG. 18 will be completely offset from the tooth aligned to connecting line 139 in FIG. 19. This may further increase the dispersing of the over-ground region.

Figure 20:
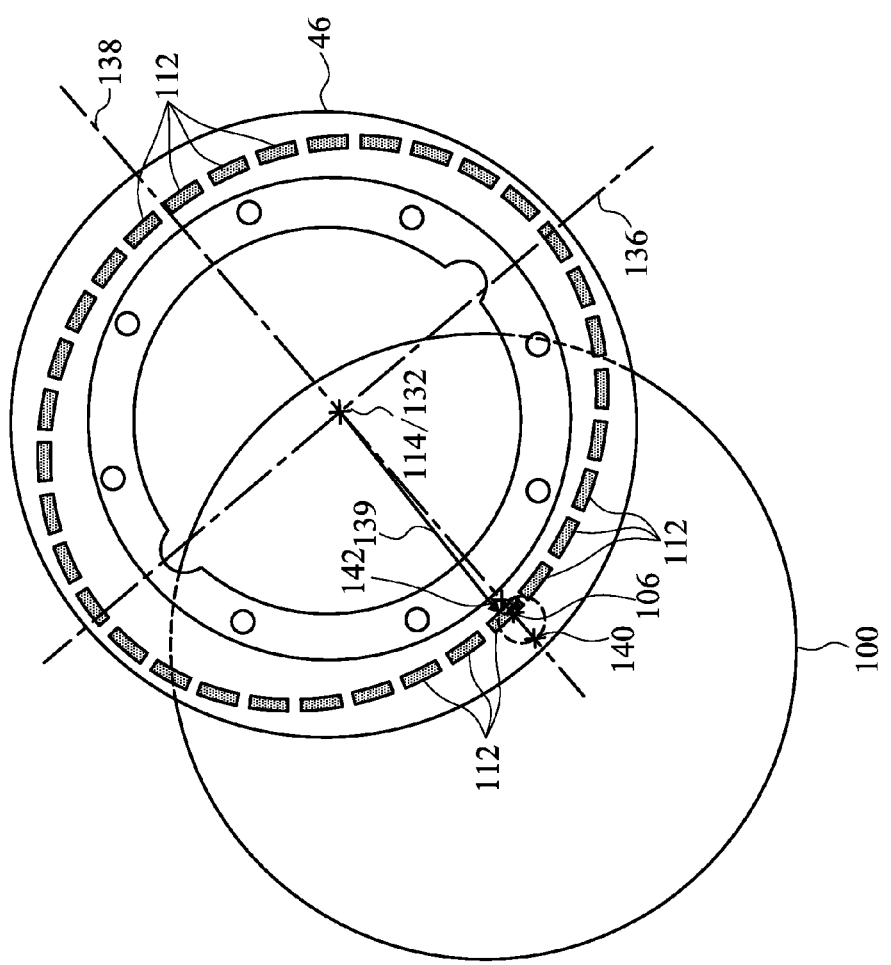

FIG. 20 illustrates another embodiment wherein at a moment when short axis 138 overlaps connecting line 139, axis 106 is outside of ring 134. Alternatively stated, with grinding wheel 46 is rotated from the position shown in FIG. 18 to the position shown in FIG. 20, the teeth 112 aligned to the connecting line 139 recede passing axis 106. This means that the over-ground region is further dispersed.

The embodiments of the present disclosure have some advantageous features. By designing the teeth of the grinding wheel to be aligned to an elongated circle, the over-grinding of the wafers is reduced. Experiment results indicated that by using elongated alignment of grinding teeth, the over-grinding of the center region of wafer 100 (FIG. 11) is within specification. As a comparison, the wafers ground using the same grinding conditions, except the grinding teeth are aligned to a circle, may have metal pillars 26 undesirably fully removed during the grinding, resulting in the failure of the center die in the wafer.

In accordance with some embodiments of the present disclosure, a grinding wheel includes a base disk, and a plurality of teeth protruding beyond a surface of the base disk. The plurality of teeth is aligned to an elongated ring encircling a center of the grinding wheel.

In accordance with alternative embodiments of the present disclosure, an apparatus includes a grinding wheel configured to rotate around an axis. The grinding wheel includes a base disk having a center aligned to the first axis, and a plurality of teeth protruding beyond a surface of the base disk. The plurality of teeth includes a first tooth having a first distance from the center of the base disk, and a second tooth having a second distance from the center of the base disk, with the second distance being greater than the first distance.

In accordance with alternative embodiments of the present disclosure, a method includes selecting a target reflectivity of wafer grinding processes, and performing a grinding process on a wafer. With the proceeding of the grinding process, reflectivity values of a light reflected from a surface of the wafer are measured. Upon a measured one of the reflectivity values being equal to or greater than the target reflectivity, the grinding process is stopped.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus for grinding a wafer, the apparatus comprising:
a grinding wheel configured to rotate around a first axis, the grinding wheel comprising:
a base disk; and
a plurality of teeth protruding beyond a surface of the base disk, wherein the plurality of teeth is aligned to an elongated ring encircling a center of the grinding wheel; and
a turntable configured to rotate around a second axis misaligned from the first axis; and
a chuck over the turntable and configured to rotate along with the turntable, wherein the grinding wheel faces a portion of the chuck, wherein the plurality of teeth is configured so that when a tooth having a minimum distance from the first axis passes through a connecting line pointing from the first axis to the second axis, the tooth overlaps the second axis, and the minimum distance is equal to or greater than a distance between the first axis and the second axis.

2. The apparatus of claim 1, wherein a first tooth in the plurality of teeth has a first distance from the center, and a second tooth in the plurality of teeth has a second distance from the center, and the first distance is greater than the second distance by more than a width of the teeth.

3. The apparatus of claim 1, wherein a first tooth in the plurality of teeth has a first distance from the center, and a second tooth in the plurality of teeth has a second distance from the center, and the first distance is greater than the second distance by more than about 1 mm.

4. The apparatus of claim 3, wherein the first distance is greater than the second distance by a difference in a range between about 2 mm and about 9 mm.

5. The apparatus of claim 1, wherein the base disk comprises an outer edge and an inner edge forming a first circle and a second circle, respectively, with the center of the grinding wheel being the center of the first circle and the second circle.

6. The apparatus of claim 1, wherein the grinding wheel is configured to be raised up and lowered down.

7. The apparatus of claim 1, wherein the plurality of teeth is formed of an abrasive material.

8. The apparatus of claim 1, wherein the plurality of teeth is aligned to a ring having an oval shape.

9. An apparatus comprising:
a grinding wheel configured to rotate around a first axis, the grinding wheel comprising:
a base disk having a center aligned to the first axis; and
a plurality of teeth protruding beyond a surface of the base disk, wherein the plurality of teeth comprises:
a first tooth having a minimum distance from the center of the base disk; and
a second tooth having a maximum distance from the center of the base disk, with the maximum distance being greater than the minimum distance;
a chuck; and
a turntable underlying the chuck, wherein the turntable is configured to rotate around a second axis, with the second axis being offset from the first axis, wherein the first tooth is configured so that when the first tooth passes through a connecting line pointing from the first axis to the second axis, the first tooth overlaps the second axis, and the minimum distance is equal to or greater than a distance between the first axis and the second axis.

10. The apparatus of claim 9, wherein the plurality of teeth further comprises a third tooth having a third distance from the center of the base disk, with the third distance being greater than the minimum distance and smaller than the maximum distance.

11. The apparatus of claim 9, wherein teeth increasingly distal the first tooth and proximal the second tooth have increasingly greater distances from the center.

12. The apparatus of claim 9, wherein the plurality of teeth is aligned to a ring having an oval shape.

13. The apparatus of claim 9, wherein a difference between the minimum distance and the maximum distance is greater than a width of one of the plurality of teeth, and the width is measured along a direction pointing from the center of the base disk to the one of the plurality of teeth.

14. The apparatus of claim 9, wherein a difference between the minimum distance and the maximum distance is greater than about 1 mm.

15. A method comprising:
selecting a target reflectivity of wafer grinding processes;
performing a grinding process on a molding compound of a wafer, and with a proceeding of the grinding process, measuring reflectivity values of a light reflected from a surface of the wafer; and
upon a measured one of the reflectivity values being equal to or greater than the target reflectivity, stopping the grinding process.

16. The method of claim 15 further comprising, when the target reflectivity is reached, performing an extended grinding to remove a layer of the wafer having a pre-determined thickness, wherein the step of stopping the grinding process is performed upon finishing of the extended grinding.

17. The method of claim 15 further comprising, when the target reflectivity is reached, performing an extended grinding for a pre-determined period of time, and wherein the step of stopping the grinding process is performed upon finishing of the extended grinding.

18. The method of claim 15, wherein the wafer comprises:
a plurality of device dies, wherein the molding compound is disposed in spaces between the plurality of device dies and over the plurality of device dies.

19. The method of claim 15, wherein the step of selecting the target reflectivity comprises:
grinding a sample wafer having a same structure as the wafer;
during the step of grinding the sample wafer, monitoring reflectivity values of a top surface of the sample wafer;

periodically inspecting the sample wafer to determine an optimal end point of the grinding process; and recording one of the reflectivity values corresponding to the optimal end point as the target reflectivity.

20. The method of claim 15, wherein the reflectivity is measured using non-contact gauges.

* * * * *